US012721067B2

(12) United States Patent
Kaliappan et al.

(10) Patent No.: US 12,721,067 B2
(45) Date of Patent: Aug. 25, 2026

(54) TITANIUM NITRIDE GAPFILL PROCESSES FOR SEMICONDUCTOR DEVICES

(71) Applicant: Applied Materials, Inc., Santa Clara, CA (US)

(72) Inventors: Muthukumar Kaliappan, Fremont, CA (US); Zhebo Chen, Santa Clara, CA (US); Michael Haverty, Mountain View, CA (US); Yongjing Lin, San Jose, CA (US); Shih Chung Chen, Cupertino, CA (US); Gang Shen, San Jose, CA (US); Alexander Jansen, Danville, CA (US); Janardhan Devrajan, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 433 days.

(21) Appl. No.: 18/228,301

(22) Filed: Jul. 31, 2023

(65) Prior Publication Data

US 2025/0046600 A1 Feb. 6, 2025

(51) Int. Cl.
*H10P 14/692* (2026.01)
*C23C 16/34* (2006.01)
(Continued)

(52) U.S. Cl.
CPC ........ *H10P 14/69394* (2026.01); *C23C 16/34* (2013.01); *C23C 16/45553* (2013.01); *H10D 30/014* (2025.01); *H10P 14/6339* (2026.01)

(58) Field of Classification Search
CPC ........... H10P 14/6339; H01L 21/02186; H01L 21/0228; H10D 30/43; H01D 30/43
See application file for complete search history.

(56) References Cited

U.S. PATENT DOCUMENTS

2012/0052681 A1 3/2012 Marsh
2018/0061628 A1 3/2018 Ou
(Continued)

FOREIGN PATENT DOCUMENTS

KR 20220000351 A 1/2022
WO 2019040046 A1 2/2019

OTHER PUBLICATIONS

PCT International Search Report and Written Opinion in PCT/US2024/040165 dated Nov. 6, 2024, 11 pages.
(Continued)

*Primary Examiner* — Marc-Anthony Armand
(74) *Attorney, Agent, or Firm* — SERVILLA WHITNEY LLC

(57) ABSTRACT

One or more embodiments of the disclosure are directed to methods of forming structures that are useful for FEOL and BEOL processes. Embodiments of the present disclosure advantageously provide methods of depositing titanium nitride (TiN) in high aspect ratio (AR) structures with small dimensions. Some embodiments advantageously provide seam-free high-quality TiN films to fill high AR trenches with small dimensions. Embodiments of the present disclosure advantageously provide methods of filling 3D structures, such as finFETs, GAAs, and the like, without creating a seam. The methods include selective deposition processes using blocking compounds in order to provide seam-free TiN gapfill in 3D structures, such as GAA devices.

20 Claims, 5 Drawing Sheets

(51) Int. Cl.

| | |
|---|---|
| ***C23C 16/455*** | (2006.01) |
| ***H10D 30/01*** | (2025.01) |
| ***H10P 14/60*** | (2026.01) |

(56) References Cited

U.S. PATENT DOCUMENTS

| | | | | |
|---|---|---|---|---|
| 2019/0057863 | A1* | 2/2019 | Yang | H01L 21/28176 |
| 2020/0035563 | A1 | 1/2020 | Zhang et al. | |
| 2021/0057581 | A1* | 2/2021 | Lin | H10D 30/701 |
| 2022/0052258 | A1 | 2/2022 | Cheng | |
| 2022/0216323 | A1 | 7/2022 | Lee et al. | |
| 2022/0344355 | A1* | 10/2022 | Lin | H10B 10/125 |
| 2022/0384607 | A1 | 12/2022 | Yoshida et al. | |
| 2025/0014947 | A1* | 1/2025 | Sano | H10D 84/038 |

OTHER PUBLICATIONS

U.S. Appl. No. 18/119,080, filed Mar. 8, 2023, 53 pages.
U.S. Appl. No. 18/203,417, filed May 30, 2023, 33 pages.
U.S. Appl. No. 18/377,619, filed Oct. 6, 2023, 65 pages.
U.S. Appl. No. 63/482,295, filed Jan. 30, 2023, 36 pages.
Choi, Yoenju , et al., "Bottom-up plasma-enhanced atomic layer deposition of SiO2 by utilizing growth inhibition using NH3 plasma pre-treatment for seamless gap-fill process", Scientific Reports 12, Article No. 15756 (2022).

* cited by examiner

TITANIUM NITRIDE GAPFILL PROCESSES FOR SEMICONDUCTOR DEVICES

TECHNICAL FIELD

Embodiments of the present disclosure pertain to the field of semiconductor devices and semiconductor device manufacturing. More particularly, embodiments of the disclosure relate to titanium nitride (TiN) gapfill processes for semiconductor devices, such as transistors.

BACKGROUND

Integrated circuits have evolved into complex devices that can include millions of transistors, capacitors, and resistors on a single chip. In the course of integrated circuit evolution, functional density (i.e., the number of interconnected devices per chip area) has generally increased while geometry size (i.e., the smallest component (or line) that can be created using a fabrication process) has decreased.

The transistor is a key component of most integrated circuits. Since the drive current, and therefore speed, of a transistor is proportional to the gate width of the transistor, faster transistors generally require larger gate width. Thus, there is a trade-off between transistor size and speed, and "fin" field-effect transistors (finFETs) have been developed to address the conflicting goals of a transistor having maximum drive current and minimum size. FinFETs are characterized by a fin-shaped channel region that greatly increases the size of the transistor without significantly increasing the footprint of the transistor and are now being applied in many integrated circuits. However, finFETs have their own drawbacks.

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, finFET, and a gate-all-around (GAA) structures. The GAA device structure includes several lattice matched channels suspended in a stacked configuration and connected by source/drain regions. The GAA structure provides good electrostatic control and can find broad adoption in semiconductor manufacturing processes.

In manufacturing, three-dimensional (3D) structures, such as finFETs, GAAs, and the like, are made by atomic layer deposition of titanium nitride (TiN) and tungsten (W) stacks. A seam is often observed from an ALD or CVD deposited TiN film. This seam creates issues during downstream processes.

Accordingly, there is an ongoing need in the art for methods to fill 3D structures, such as finFETs, GAAs, and the like, without creating a seam.

SUMMARY

One or more embodiments of the disclosure are directed to a method of forming a semiconductor device. The method comprises conformally depositing a first titanium nitride (TiN) layer on a semiconductor structure formed on a top surface of a semiconductor substrate, the semiconductor structure comprising a plurality of nanosheets, each of the plurality of nanosheets separated by a trench; exposing the plurality of nanosheets having the first TiN layer thereon to a blocking compound to form a blocking layer on a portion of the first TiN layer; forming a second titanium nitride (TiN) layer to fill a portion of the trench, the second TiN layer growing from within the trench; removing the blocking layer; and forming a third titanium nitride (TiN) layer. The first TiN layer, the second TiN layer, and the third TiN layer combine to fill the trench with a titanium nitride (TiN) gapfill material that is substantially free of seams and voids.

Additional embodiments of this disclosure relate to a method of forming a semiconductor device. The method comprises forming a superlattice structure on a top surface of a substrate, the superlattice structure comprising a plurality of nanosheet channel layers and a corresponding plurality of nanosheet release layers alternatingly arranged in a plurality of stacked pairs; patterning the superlattice structure to remove the plurality of nanosheet release layers and form a semiconductor structure comprising a plurality of nanosheets, each of the plurality of nanosheets separated by a trench; conformally depositing a first titanium nitride (TiN) layer on the plurality of nanosheets; exposing the plurality of nanosheets having the first TiN layer thereon to a blocking compound to form a blocking layer on a portion of the first TiN layer; forming a second titanium nitride (TiN) layer to fill a portion of the trench, the second TiN layer growing from within the trench; removing the blocking layer; and forming a third titanium nitride (TiN) layer. The first TiN layer, the second TiN layer, and the third TiN layer combine to fill the trench with a titanium nitride (TiN) gapfill material that is substantially free of seams and voids.

Further embodiments of this disclosure relate to a non-transitory computer readable medium including instructions, that, when executed by a controller of a processing chamber, causes the processing chamber to: conformally deposit a first titanium nitride (TiN) layer on a semiconductor structure formed on a top surface of a semiconductor substrate, the semiconductor structure comprising a plurality of nanosheets, each of the plurality of nanosheets separated by a trench; expose the plurality of nanosheets having the first TiN layer thereon to a blocking compound to form a blocking layer on a portion of the first TiN layer; form a second titanium nitride (TiN) layer to fill a portion of the trench, the second TiN layer growing from within the trench; remove the blocking layer; and form a third titanium nitride (TiN) layer. The first TiN layer, the second TiN layer, and the third TiN layer combining to fill the trench with a titanium nitride (TiN) gapfill material that is substantially free of seams and voids.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
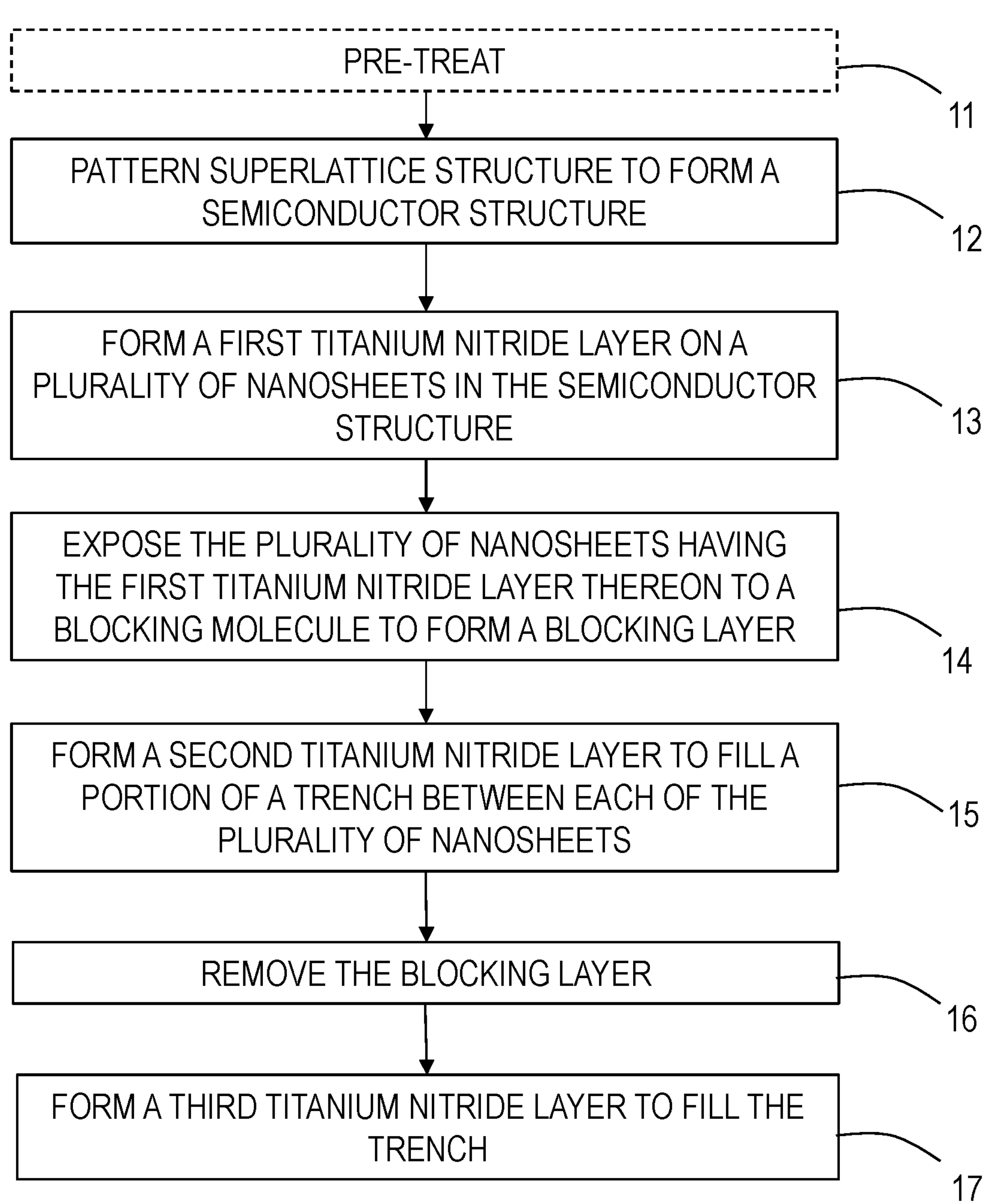
FIG. 1 illustrates a process flow diagram of a method of forming a semiconductor device in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term “substrate” and “wafer” are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A “substrate surface”, as used herein, refers to any portion of a substrate or portion of a material surface formed on a substrate upon which film processing is performed. For example, a substrate surface on which processing can be performed include materials such as silicon, silicon oxide, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pre-treatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term “substrate surface” is intended to include such underlayer as the context indicates. Thus, for example, where a film/layer or partial film/layer has been deposited onto a substrate surface, the exposed surface of the newly deposited film/layer becomes the substrate surface. Substrates may have various dimensions, such as 200 mm or 300 mm diameter wafers, as well as rectangular or square panes. In some embodiments, the substrate comprises a rigid discrete material. What a given substrate surface comprises will depend on what films are to be deposited, as well as the particular chemistry used.

“Atomic layer deposition” or “cyclical deposition” as used herein refers to a process comprising the sequential exposure of two or more reactive compounds to deposit a layer of material on a substrate surface. As used in this specification and the appended claims, the terms “reactive compound”, “reactive gas”, “reactive species”, “precursor”, “process gas” and the like are used interchangeably to mean a substance with a species capable of reacting with the substrate surface or material on the substrate surface in a surface reaction (e.g., chemisorption, oxidation, reduction, cycloaddition). The substrate, or portion of the substrate, is exposed sequentially to the two or more reactive compounds which are introduced into a reaction zone of a processing chamber.

In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term “substantially” used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A, e.g., manganese precursor, ruthenium precursor, or a manganese-ruthenium precursor) is pulsed into the reaction zone followed by a first time delay. Next, a second precursor or compound B (e.g., reductant) is pulsed into the reaction zone followed by a second delay. During each time delay, a purge gas, such as argon, may be introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B, and purge gas is a cycle. A cycle can start with either compound A or compound B and continue the respective order of the cycle until achieving a film with the predetermined thickness.

A “pulse” or “dose” as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate and exhibit a doping profile suitable for a particular application. The gate is positioned over the channel region and includes a gate dielectric interposed between a gate electrode and the channel region in the substrate. In one or ore more embodiments, the gate surrounds all of the nanosheets between the bottom substrate and above channels.

As used herein, the term "field effect transistor" or "FET" refers to a transistor that uses an electric field to control the electrical behavior of the device. Enhancement mode field effect transistors generally display very high input impedance at low temperatures. The conductivity between the drain and source terminals is controlled by an electric field in the device, which is generated by a voltage difference between the body and the gate of the device. The FET's three terminals are source(S), through which the carriers enter the channel; drain (D), through which the carriers leave the channel; and gate (G), the terminal that modulates the channel conductivity. Conventionally, current entering the channel at the source(S) is designated Is and current entering the channel at the drain (D) is designated $I_D$. Drain-to-source voltage is designated $V_{Ds}$. By applying voltage to gate (G), the current entering the channel at the drain (i.e., $I_D$) can be controlled.

The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p region. If the MOSFET is a p-channel or pMOS FET, then the source and drain are p+ regions and the body is an n region. The source is so named because it is the source of the charge carriers (electrons for n-channel, holes for p-channel) that flow through the channel; similarly, the drain is where the charge carriers leave the channel.

As used herein, the term "fin field-effect transistor (FinFET)" refers to a MOSFET transistor built on a substrate where the gate is placed on two or three sides of the channel, forming a double- or triple-gate structure. FinFET devices have been given the generic name FinFETs because the channel region forms a "fin" on the substrate. FinFET devices have fast switching times and high current density.

As used herein, the term "gate all-around (GAA)," is used to refer to an electronic device, e.g., a transistor, in which the gate material surrounds the channel region on all sides. The channel region of a GAA transistor may include nano-wires or nano-slabs, bar-shaped channels, or other suitable channel configurations known to one of skill in the art. In one or more embodiments, the channel region of a GAA device has multiple horizontal nanowires or horizontal bars vertically spaced, making the GAA transistor a stacked horizontal gate-all-around (hGAA) transistor.

As used herein, the term "nanowire" refers to a nanostructure, with a diameter on the order of a nanometer ($10^{-9}$ meters). Nanowires can also be defined as the ratio of the length to width being greater than 1000. Alternatively, nanowires can be defined as structures having a thickness or diameter constrained to tens of nanometers or less and an unconstrained length. Nanowires are used in transistors and some laser applications, and, in one or more embodiments, are made of semiconducting materials, metallic materials, insulating materials, superconducting materials, or molecular materials. In one or more embodiments, nanowires are used in transistors for logic CPU, GPU, MPU, and volatile (e.g., dynamic random access memory (DRAM)) and non-volatile (e.g., NAND) devices. As used herein, the term "nanosheet" refers to a two-dimensional nanostructure with a thickness in a scale ranging from about 0.1 nm to about 1000 nm. As used herein, the term "dynamic random access memory" or "DRAM" refers to a memory cell that stores a datum bit by storing a packet of charge (i.e., a binary one), or no charge (i.e., a binary zero) on a capacitor.

Without intending to be bound by theory, it is thought that relaxation in a vertically stacked superlattice structure comprising one or more hGAAs causes defects in nanosheet channel layers within the structure. Embodiments of the present disclosure advantageously provide transistors which comprise a fully strained vertically stacked superlattice structure having nanosheet channel layers that are free or substantially free of defects. In some embodiments, the presence of defects in the nanosheet channel layers are determined by a reciprocal space mapping (RSM) method. Generally, an RSM method is an x-ray diffraction method of collecting diffraction data of the vertically stacked superlattice structure in which the presence of defects may be observed. As used herein, the term "substantially free" means that the nanosheet channel layers are substantially free of defects as determined by an RSM method.

Generally, front-end of line (FEOL) refers to the first portion of integrated circuit fabrication, including transistor fabrication, middle of line (MOL) connects the transistor and interconnect parts of a chip using a series of contact structures, and back-end of line (BEOL) refers to a series of process steps after transistor fabrication through completion of a wafer. One or more embodiments of the disclosure are directed to methods of forming structures that are useful for FEOL and BEOL processes.

Embodiments of the present disclosure advantageously provide methods of depositing titanium nitride (TiN) in high aspect ratio (AR) structures with small dimensions. Some embodiments advantageously provide seam-free high-quality TiN films to fill high AR trenches with small dimensions.

Embodiments of the present disclosure advantageously provide methods of filling 3D structures, such as finFETs, GAAs, DRAM word lines, and the like, without creating a seam. One or more embodiments of the disclosure are directed to methods seam-free titanium nitride gapfill in GAA devices.

In one or more embodiments, transistors, such as the starting structure of a GAA transistors shown in the accompanying drawings, are fabricated using a standard process flow known to the skilled artisan.

It has advantageously been found that selective deposition processes can be used to provide seam-free titanium nitride gapfill in 3D structures, such as GAA devices. Selective deposition has shown promise in device miniaturization as it has the potential to remove costly lithographic steps by simplifying integration schemes. Selective deposition of materials can be accomplished in a variety of ways. A chemical precursor may react selectively with one surface relative to another surface (metallic or dielectric). Process parameters such as pressure, substrate temperature, precursor partial pressures, and/or gas flows might be tuned to modulate the chemical kinetics of a particular surface reaction. Another possible scheme involves surface pretreatments that can be used to activate or deactivate a surface of interest to an incoming film deposition precursor. For example, a self-assembled monolayer (SAM) can be formed on a surface to prevent subsequent deposition on that surface. Advantageously, a SAM can be used to prevent subsequent deposition within a trench in the GAA device to enable seam-free titanium nitride gapfill.

The embodiments of the disclosure are described by way of the Figures, which illustrate devices (e.g., transistors) and processes for forming transistors in accordance with one or more embodiments of the disclosure. The processes shown are merely illustrative possible uses for the disclosed processes, and the skilled artisan will recognize that the disclosed processes are not limited to the illustrated applications.

FIG. 1 illustrates a process flow diagram of a method 10 of forming a semiconductor device 100. The semiconductor device 100 (e.g., the GAA transistor) shown in FIGS. 2A-2G may be manufactured by the method 10 illustrated in FIG. 1.

The method 10 comprises: optionally pre-treating a semiconductor substrate (operation 11); patterning a superlattice structure on a top surface of the semiconductor substrate to form a semiconductor structure, the superlattice structure comprising a plurality of nanosheet channel layers and a corresponding plurality of nanosheet release layers alternatingly arranged in a plurality of stacked pairs to remove the plurality of nanosheet release layers (operation 12), the semiconductor structure comprising a plurality of nanosheets, each of the plurality of nanosheets separated by a trench; conformally depositing a first titanium nitride (TiN) layer on the plurality of nanosheets (operation 13); exposing the plurality of nanosheets having the first TiN layer thereon to a blocking compound to form a blocking layer on a portion of the first TiN layer (operation 14); forming a second titanium nitride (TiN) layer to fill a portion of the trench, the second TiN layer growing from within the trench (operation 15); removing the blocking layer (operation 16); and forming a third titanium nitride (TiN) layer (operation 17). The first TiN layer, the second TiN layer, and the third TiN layer combining to fill the trench with a titanium nitride (TiN) gapfill material that is substantially free of seams and voids.

Figures 2A, 2B:
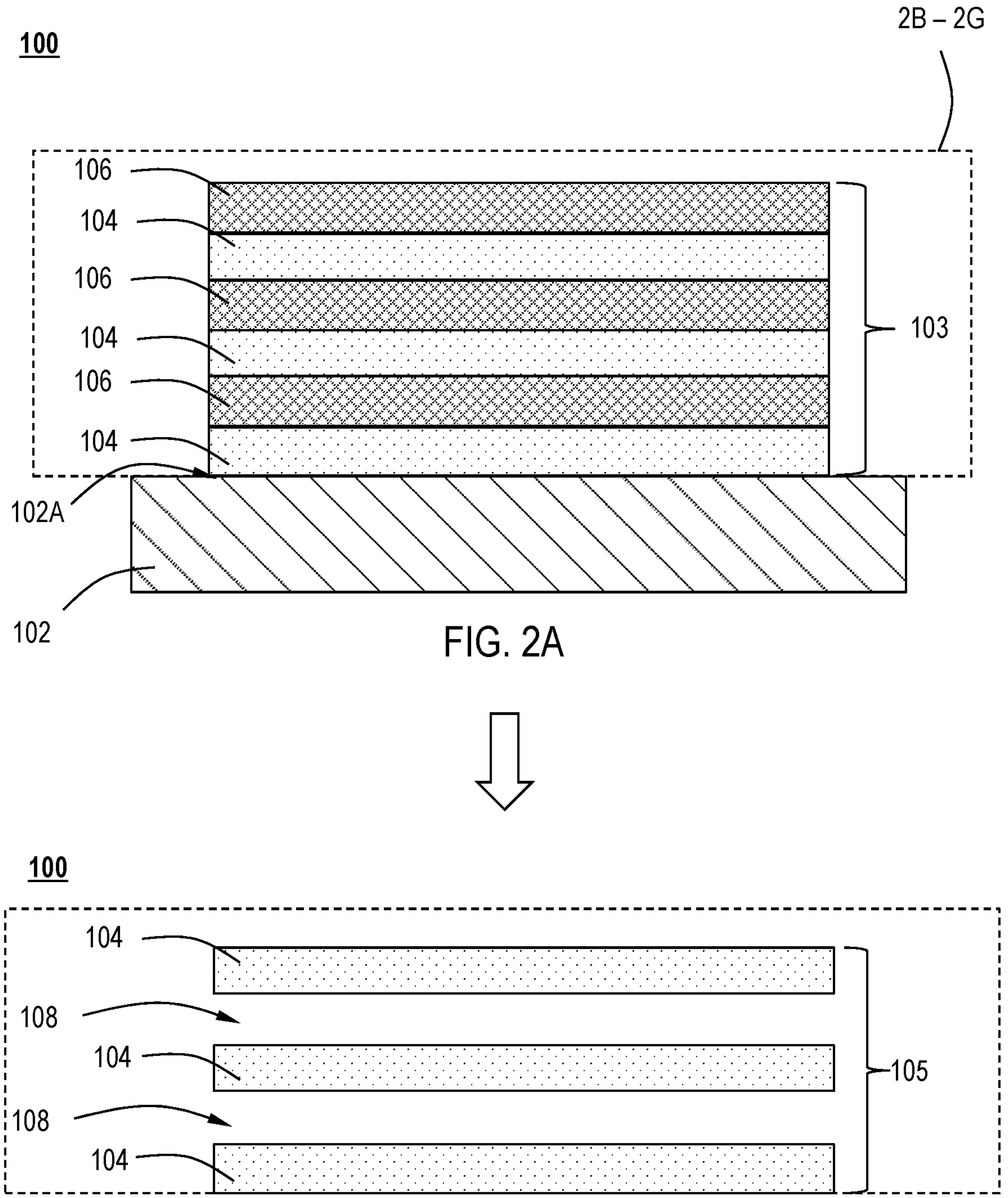
FIG. 2A illustrates a cross-sectional schematic view of a semiconductor device having a superlattice structure on a top surface of a semiconductor substrate prior to a patterning process in accordance with one or more embodiments of the disclosure.
FIG. 2B illustrates a cross-sectional schematic view of the semiconductor device of FIG. 2A including a semiconductor structure having a plurality of nanosheets separated by a trench formed after the patterning process in accordance with one or more embodiments of the disclosure.

FIG. 2A illustrates a cross-sectional schematic view of a semiconductor device 100 having a superlattice structure 103 (e.g., a vertically stacked superlattice structure) on a top surface 102A of a semiconductor substrate 102. The semiconductor substrate 102 can be any suitable substrate material. In one or more embodiments, the semiconductor substrate 102 comprises a semiconductor material, e.g., silicon (Si), carbon (C), germanium (Ge), silicon germanium (SiGe), gallium arsenide (GaAs), indium phosphate (InP), indium gallium arsenide (InGaAs), indium aluminum arsenide (InAlAs), germanium (Ge), silicon germanium (SiGe), other semiconductor materials, or any combination thereof. In one or more embodiments, the semiconductor substrate 102 comprises one or more of silicon (Si), germanium (Ge), gallium (Ga), arsenic (As), indium (In), phosphorus (P), or selenium (Se). Although a few examples of materials from which the substrate 102 may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one or more embodiments, the semiconductor substrate 102 is a p-type or n-type substrate. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers.

In some embodiments, the superlattice structure 103 comprise alternating layers of nanosheet channel layer 104 and nanosheet release layer 106. In some embodiments, the plurality of nanosheet release layers 106 and the plurality of nanosheet channel layers 104 can comprise any number of lattice matched material pairs suitable for forming the vertically stacked superlattice structure 103. In some embodiments, the superlattice structure 103 has in a range of from 1 to 5 pairs of alternating layers of nanosheet channel layers 104 and nanosheet release layers 106.

The nanosheet release layers 106 may have any suitable thickness. In one or more embodiments, each nanosheet release layer 106 has a thickness in a range of from 5 nm to 15 nm. The nanosheet channel layers 104 may have any suitable thickness. In one or more embodiments, each nanosheet channel layer 104 has a thickness in a range of from 5 nm to 15 nm.

In some embodiments, each of the nanosheet channel layers 104 independently comprises silicon (Si). In some embodiments, each of the nanosheet release layers 106 independently comprises silicon germanium (SiGe).

In some embodiments, each of the nanosheet channel layers 104 independently comprises silicon germanium (SiGe). In some embodiments, each of the nanosheet release layers 106 independently comprises silicon (Si).

FIG. 2A includes a region that is denoted by a dashed-box that is labeled 2B-2G. The region labeled 2B-2G is illustrated in FIGS. 2B-2G shows subsequent operations/processes of the methods described herein.

FIG. 2B illustrates the semiconductor device 100 after the patterning process. More particularly, FIG. 2B illustrates a cross-sectional schematic view of a semiconductor structure 105 having a plurality of nanosheets 104 separated by a trench 108 formed after the patterning process. The patterning process may include any suitable process known to the skilled artisan. The patterning process is performed at operation 12 to remove the plurality of nanosheet release layers 106 and form the trench 108. The plurality of nanosheet channel layers 104 from the superlattice structure 103 remain in the semiconductor structure 105 after the patterning process and will be referred to as "the plurality of nanosheets 104." The plurality of nanosheets 104 may include any number of nanosheets 104. The Figures include three nanosheets 104 for illustrative purposes. It is to be understood that the disclosure is not limited to a semiconductor device having three nanosheets.

The trench 108 can have any suitable aspect ratio (ratio of the depth of the trench to the width of the trench). In some embodiments, the aspect ratio is greater than or equal to about 5:1, 10:1, 15:1, 20:1, 25:1, 30:1, 35:1, 40:1, 45:1, 50:1, 75:1, or 100:1.

In one or more embodiments, the method 10 optionally includes pre-treating the semiconductor substrate (operation 11) prior to conformally depositing the first TiN layer (operation 13). In one or more embodiments, the semiconductor substrate 102 may be treated prior to patterning the superlattice structure 103 to form the semiconductor structure 105 (operation 12), after patterning the superlattice structure 103, or both.

The pre-treatment at operation 11 can be any suitable pre-treatment known to the skilled artisan. Suitable pre-treatments include, but are not limited to, pre-heating, cleaning, soaking, native oxide removal, or deposition or removal of any material, or any processing operation used to fabricate the GAA transistors of the present disclosure.

Figures 2C, 2D, 2E:
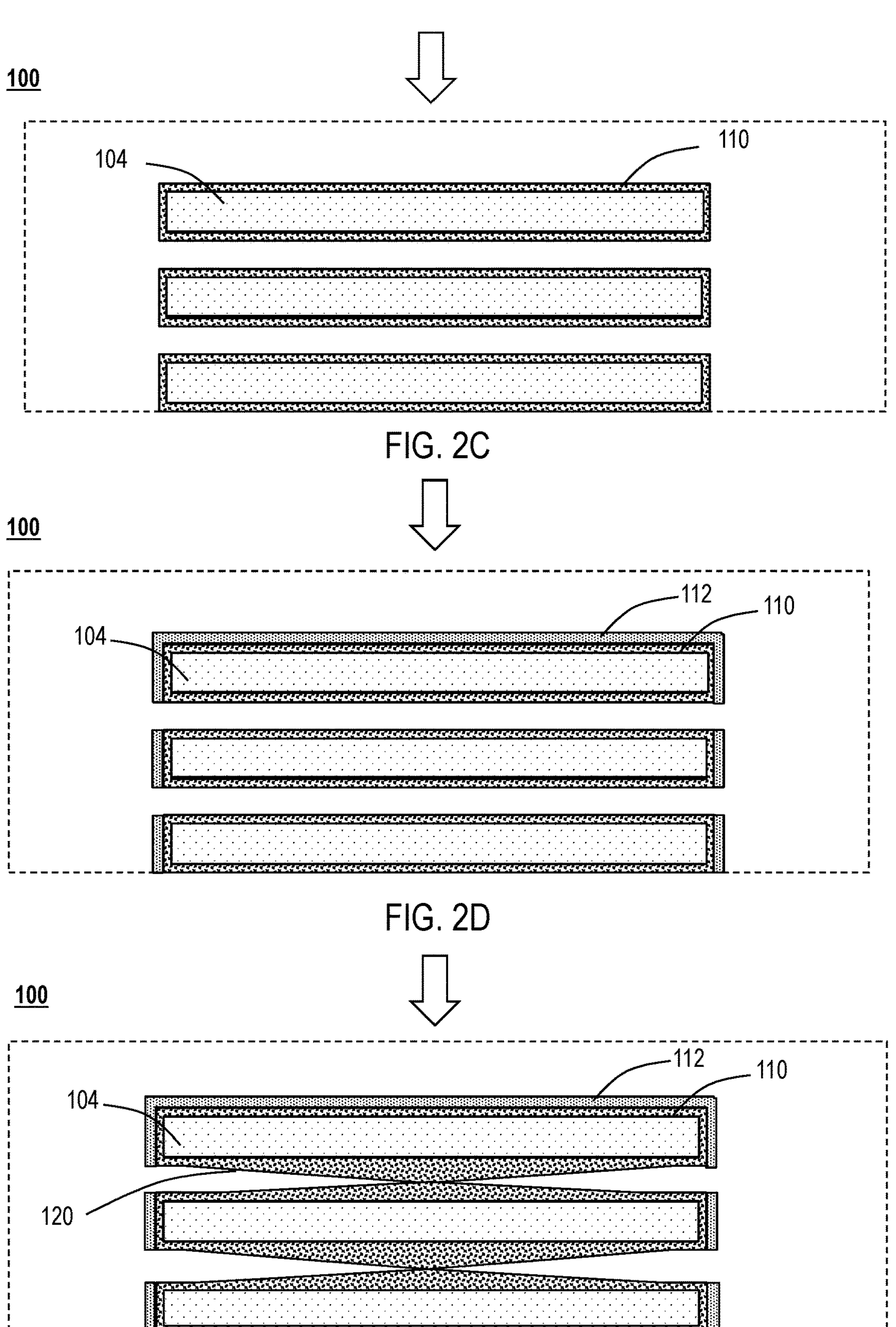
FIG. 2C illustrates a cross-sectional schematic view of the semiconductor device of FIG. 2B after conformally depositing a first titanium nitride (TiN) layer in accordance with one or more embodiments of the disclosure.
FIG. 2D illustrates a cross-sectional schematic view of the semiconductor device of FIG. 2C after forming a blocking layer on a portion of the first TiN layer in accordance with one or more embodiments of the disclosure.
FIG. 2E illustrates a cross-sectional schematic view of the semiconductor device of FIG. 2D after forming a second titanium nitride (TiN) layer to fill a portion of the trench in accordance with one or more embodiments of the disclosure.

FIG. 2C illustrates a cross-sectional schematic view of the semiconductor device 100 of FIG. 2B after conformally depositing a first titanium nitride (TiN) layer 110 on the plurality of nanosheets 104 (operation 13 of method 10). As used herein, as will be understood by the skilled artisan, a layer which is "conformal" or "conformally deposited" refers to a layer where the thickness is about the same throughout. A layer which is conformal varies in thickness by less than or equal to about 5%, 2%, 1% or 0.5%.

In one or more embodiments, the first TiN layer 110 is conformally deposited by atomic layer deposition (ALD). In some embodiments, the first TiN layer 110 is conformally deposited by sequentially exposing the substrate 102 (e.g., the plurality of nanosheets 104 of the semiconductor structure 105) to a titanium-containing precursor, purge, a nitrogen-containing precursor, purge. The titanium-containing precursor may be any suitable precursor that includes titanium known to the skilled artisan. The nitrogen-containing precursor may be any suitable precursor that includes nitrogen known to the skilled artisan. In some embodiments, the titanium-containing precursor comprises titanium tetrachloride ($TiCl_4$) and the nitrogen-containing precursor comprises ammonia ($NH_3$).

In one or more embodiments, the first TiN layer 110 is a continuous layer. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

FIG. 2D illustrates a cross-sectional schematic view of the semiconductor device 100 of FIG. 2C after forming a blocking layer 112 on a portion of the first TiN layer 110 (operation 14 of method 10). The first TiN layer 110 has a portion that is not within the trench 108 and a portion that is within the trench 108.

In one or more embodiments, the blocking layer 112 is formed by exposing the plurality of nanosheets 104 having the first TiN layer 110 thereon to a blocking compound. As used herein, as will be understood by the skilled artisan, the terms "blocking layer 112" and "self-assembled monolayer (SAM) 112" may be used interchangeably.

The blocking layer 112 may be formed by exposing the plurality of nanosheets 104 having the first TiN layer 110 thereon to the blocking compound.

In one or more embodiments, the blocking compound comprises a compound comprising an unsaturated hydrocarbon or a saturated hydrocarbon, a silicon-containing compound, or a sulfur-containing compound. The compounds comprising the unsaturated hydrocarbon and/or the saturated hydrocarbon include at least one alkyl chain having any suitable number of carbon atoms. As used herein, the term "alkyl chain" or "alkyl group" should construed as including, but not limited to, an acyclic group, such as a linear alkyl group or a branched alkyl group, and a cyclic alkyl group.

The blocking compounds described herein include a head group and a tail group, as will be understood and appreciated by the skilled artisan. The head group of the blocking compound binds to the target surfaces selectively with control of the molecular interaction.

The binding affinity properties and hydrophobicity of SAMs can be tuned by adjusting one of the position, length, size and number of substitute R, $R_1$, or $R_2$ groups of the tail end on any substitution site of a head group, which will be described in greater detail below.

In one or more embodiments, the blocking compound comprises a formula of $R_1$—C≡C—$R_2$, where each of $R_1$ and $R_2$ are independently hydrogen (H) or an alkyl chain. In embodiments where the blocking compound comprises the formula of $R_1$—C≡C—$R_2$, where each of $R_1$ and $R_2$ are independently hydrogen (H) or an alkyl chain, $R_1$ and $R_2$ may or may not be the same. In some embodiments, the blocking compound comprises the formula of $R_1$—C≡C—$R_2$, where each of $R_1$ and $R_2$ are independently hydrogen (H) or an alkyl chain comprising 1 to 15 carbon atoms. In one or more embodiments, each of $R_1$ and $R_2$ are independently hydrogen (H) or a linear alkyl chain comprising 1 to 15 carbon atoms. In one or more embodiments, $R_1$ and $R_2$ are the same.

In embodiments where the blocking compound comprises the formula of $R_1$—C≡C—$R_2$, the head group includes the triple bonded carbons, and the tail group includes $R_1$ and $R_2$. Accordingly, in embodiments where the blocking compound comprises the formula of $R_1$—C≡C—$R_2$, the carbon atoms from the triple bonded carbons selectively react and bind to the target surface, e.g., the surfaces of the first TiN layer 110.

In one or more embodiments, the blocking compound comprises a formula of H—C≡C—$R_3$, where $R_3$ is an alkyl chain. In one or more embodiments, the blocking compound comprises the formula of H—C≡C—$R_3$, where $R_3$ is an alkyl chain comprising from 1 to 20 carbon atoms. In one or more embodiments, $R_3$ is a linear alkyl chain comprising from 1 to 20 carbon atoms.

In one or more embodiments where the blocking compound comprises the formula of H—C≡C—$R_3$, the head group includes the triple bonded carbons, and the tail group includes $R_3$. Accordingly, in embodiments where the blocking compound comprises the formula of H—C≡C—$R_3$, the carbon atoms from the triple bonded carbons selectively react and bind to the target surface, e.g., the surfaces of the first TiN layer 110.

In one or more embodiments, the blocking compound comprises a formula of R—$SiH_3$, where R is an alkyl chain. In one or more embodiments, R is selected from a linear alkyl chain and a branched alkyl chain comprising from 1 to 20 carbon atoms.

In one or more embodiments where the blocking compound comprises the formula of R—$SiH_3$, the head group includes the silicon (Si) atom, and the tail group includes R. Accordingly, in embodiments where the blocking compound comprises the formula of R—$SiH_3$, the silicon (Si) atom selectively reacts and binds to the target surface, e.g., the surfaces of the first TiN layer 110.

In one or more embodiments, the blocking compound comprises a formula of R—$SiCl_3$, where R is an alkyl chain. In one or more embodiments, R is selected from a linear alkyl chain and a branched alkyl chain comprising from 1 to 20 carbon atoms.

In one or more embodiments where the blocking compound comprises the formula of R—$SiCl_3$, the head group includes the silicon (Si) atom, and the tail group includes R. Accordingly, in embodiments where the blocking compound comprises the formula of R—$SiCl_3$, the silicon (Si) atom selectively reacts and binds to the target surface, e.g., the surfaces of the first TiN layer 110.

In one or more embodiments, the blocking compound comprises a formula of R—SH, where R is an alkyl chain. In one or more embodiments, R is selected from a linear alkyl chain and a branched alkyl chain comprising from 1 to 20 carbon atoms.

In one or more embodiments where the blocking compound comprises the formula of R—SH, the head group includes the sulfur(S) atom, and the tail group includes R. Accordingly, in embodiments where the blocking compound comprises the formula of R—SH, the sulfur(S) atom selectively reacts and binds to the target surface, e.g., the surfaces of the first TiN layer 110.

In one or more embodiments, the blocking compound is carried in an inert carrier gas, for example, argon (Ar) gas. The blocking layer 112 inhibits or blocks deposition on the surface on which it is formed.

It has been found that adsorption strength of the titanium-containing precursor used to form the TiN layers on the blocking layer 112 is very low compared to adsorption strength of the titanium-containing precursor on a clean substrate surface, such as a silicon surface, a silicon oxide surface, or a titanium nitride (TiN) surface. It has also been found that the titanium-containing precursor desorbs from the surface of the blocking layer 112, under normal processing temperature conditions, such as in a range of about 100° C. to about 500° C., demonstrating weak adsorption and inhibition of titanium nitride (TiN) growth.

The blocking layer 112 does not form within the trench 108 or on the portion of the first TiN layer 110 that is within the trench 108. The blocking compounds described herein have a molecular size that is too large to fit within the trench 108.

In one or more embodiments, the blocking compound has a molecular size of at least 10 Å, which is too large to fit within the trench 108 having an AR greater than or equal to about 5:1, 10:1, 15:1, 20:1, 25:1, 30:1, 35:1, 40:1, 45:1, 50:1, 75:1, or 100:1.

The blocking layer 112 forms on the portion of the first TiN layer 110 that is not within the trench 108. Once the blocking layer 112 is formed, the blocking layer 112 blocks deposition on the first TiN layer 110.

The blocking layer 112 advantageously allows for continued deposition within the trench 108 between the plurality of nanosheets 104. The blocking layer 112 facilitates achievement of selective deposition on the first TiN layer 110 relative to within the trench 108.

The blocking layer 112 may be a continuous layer. It has been found that the head group of the blocking compound selectively reacts and binds to the target surface, e.g., the surfaces of the first TiN layer 110. Accordingly, the skilled artisan will appreciate that the blocking layer 112 will prevent subsequent deposition, e.g., on the first TiN layer 110, even if the blocking layer 112 is not a continuous layer.

In some embodiments, the substrate 102 is soaked in a vapor of the blocking compound. In some embodiments, the processing conditions for exposing the substrate 102 to the blocking compound may be controlled.

In some embodiments, the pressure of the processing chamber is controlled. The pressure of the processing chamber may be any suitable pressure for forming the blocking layer. In some embodiments, the pressure of the processing chamber is maintained in a range of from 1 Torr to 100 Torr.

In one or more embodiments, a flow of argon (Ar) gas is configured to carry the blocking compound from a container to the processing chamber. In some embodiments, the flow rate of the argon (Ar) gas that is configured to carry the blocking compound into the processing chamber is controlled. The flow rate of the argon (Ar) gas may be any suitable flow rate for forming the passivation layer. In some embodiments, the flow rate of the argon (Ar) gas is in a range of about 10 sccm to about 3000 sccm.

In some embodiments, the soak period, during which the blocking compound is exposed to the substrate 102, is controlled. The soak period may be any suitable period for forming the blocking layer. In some embodiments, the soak period is in a range of from about 10 seconds to about 30 minutes.

In one or more embodiments, the blocking compound is in a liquid phase when the blocking compound is in a container, such as an ampoule or a cylinder, from which the blocking compound is delivered to the chamber in a carrier gas. In some embodiments, the blocking compound is in a saturated vapor phase in the container when the container has a pressure of about 0.1 torr. In one or more embodiments, a temperature of the container is lower than the temperature in the processing chamber. In one or more embodiments, a carrier gas such as argon (Ar) gas carries the saturated vapor phase blocking compound from the container to the processing chamber. In some embodiments, a temperature of the processing chamber is controlled during exposure to the blocking compound. The temperature of the processing chamber may also be referred to as the operating temperature. In some embodiments, the temperature of the processing chamber is in a range of about 100° C. to about 500° C., or in a range of about 200° C. to about 450° C. In some embodiments, the temperature of the processing chamber is less than or equal to about 300° C., less than or equal to about 275° C., less than or equal to about 250° C., less than or equal to about 225° C., or less than or equal to about 200° C.

As the technology node advances, for example, when scaling semiconductor devices to the 3 nm node and beyond BEOL includes new interfaces such as tungsten (W), molybdenum (Mo), and ruthenium (Ru). Improving blocking compound (e.g., self-assembled monolayer (SAM)) selectivity on metal to low-K surfaces becomes more challenging, especially when these interfaces contain different kinds of impurities such as oxygen, carbon, nitrogen, fluorine, chlorine, etc. It has been determined that the pre-clean before blocking compound processes further improves blocking compound selectivity. Pre-cleaning helps control damage to low-K dielectric materials.

In some embodiments, the first TiN layer 110 is cleaned prior to exposing the first TiN layer 110 to the blocking compound. In some embodiments, the surface of the first TiN layer 110 is cleaned with a hydrogen plasma. In some embodiments, the hydrogen plasma is a conductively coupled plasma (CCP). In some embodiments, the hydrogen plasma is an inductively coupled plasma (ICP). In some embodiments, the hydrogen plasma is formed by a remote plasma source. In some embodiments, the hydrogen plasma comprises plasma of $H_2$. In some embodiments, the hydrogen plasma comprises, consists essentially of, or consists of a combination of argon (Ar) and hydrogen ($H_2$). In some embodiments, the hydrogen plasma comprises, consists essentially of, or consists of a combination of helium (He) and hydrogen ($H_2$).

Pre-cleaning of the first TiN layer 110 can occur at any suitable temperature depending on, for example, the cleaning technique. In some embodiments, pre-cleaning of the first TiN layer 110 occurs at a temperature in a range of from 20° C. to 500° C.

FIG. 2E illustrates a cross-sectional schematic view of the semiconductor device 100 of FIG. 2D after forming a second titanium nitride (TiN) layer 120 to fill a portion of the trench 108 (operation 15 of method 10).

In one or more embodiments, the second TiN layer 120 is grown from within the trench 108. The blocking layer 112 prevents growth of the second TiN layer 120 on the portion of the first TiN layer 110 that is not within the trench 108. The second TiN layer 120 may be grown by any suitable deposition process known to the skilled artisan. In some embodiments, the second TiN layer 120 is grown by an epitaxial growth process. "Epitaxy" is a process by which a deposited film is forced into a high degree of crystallographic alignment with the substrate. Epitaxial growth is broadly defined as the condensation of gas precursors to form a film on a substrate. Liquid precursors may also be used. Vapor precursors may be obtained by chemical vapor deposition (CVD) and laser ablation. The epitaxial growth process of operation 15 of method includes, but is not limited to, molecular beam epitaxy (MBE), epitaxial CVD, or atomic layer epitaxy (ALE). In one or more embodiments, the second TiN layer 120 is a continuous layer.

In one or more embodiments, the second TiN layer 120 is grown by an epitaxial growth process with a gradient thickness. In one or more embodiments where the second TiN layer 120 has a gradient thickness, the thickness of the second TiN layer 120 decreases from within the trench 108 towards an outside of the trench.

In one or more embodiments, the first TiN layer 110 and the second TiN layer 120 have the same composition. In some embodiments, the second TiN layer 120 is formed by exposing the surface to a titanium-containing precursor (titanium tetrachloride ($TiCl_4$)) and a nitrogen-containing precursor (ammonia ($NH_3$)).

Advantageously, in embodiments where the titanium-containing precursor comprises titanium tetrachloride ($TiCl_4$) and the nitrogen-containing precursor comprises ammonia ($NH_3$), the respective titanium-containing precursor and the nitrogen-containing precursor each have a molecular size that fit within the trench 108. It has been found that $TiCl_4$ has a molecular size of about 3.8 Å and $NH_3$ has a molecular size of about 1.6 Å, which advantageously allows for epitaxial growth within the trench 108 having an AR greater than or equal to about 5:1, 10:1, 15:1, 20:1, 25:1, 30:1, 35:1, 40:1, 45:1, 50:1, 75:1, or 100:1.

Figures 2F, 2G:
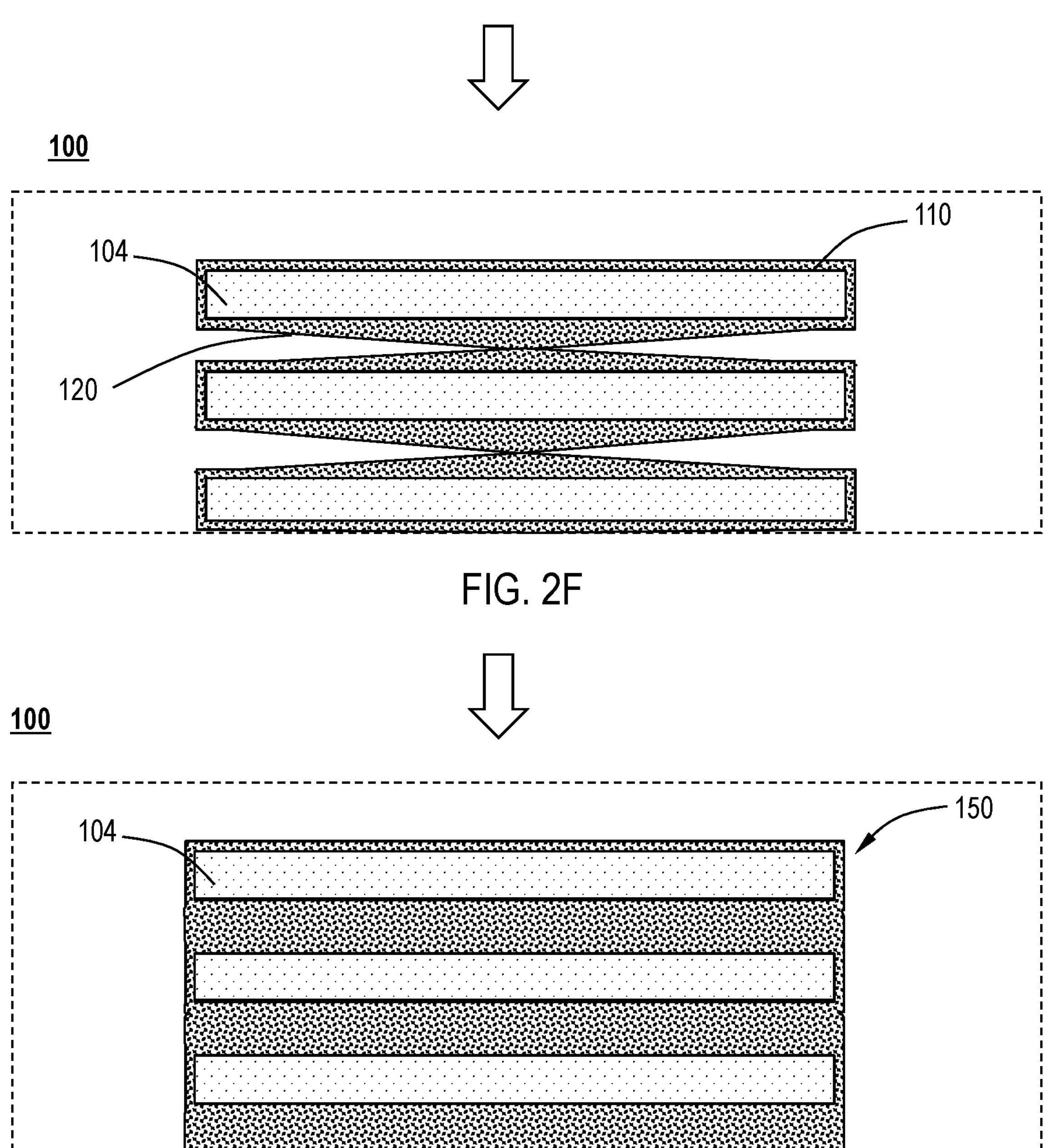
FIG. 2F illustrates a cross-sectional schematic view of the semiconductor device of FIG. 2E after removing the blocking layer in accordance with one or more embodiments of the disclosure.
FIG. 2G illustrates a cross-sectional schematic view of the semiconductor device of FIG. 2F after forming a third titanium nitride (TiN) layer, the first TiN layer, the second TiN layer, and the third TiN layer combining to fill the trench with a titanium nitride (TiN) gapfill material in accordance with one or more embodiments of the disclosure.

FIG. 2F illustrates a cross-sectional schematic view of the semiconductor device 100 of FIG. 2E after removing the blocking layer 112 (operation 16 of method 10). The blocking layer 112 may be removed by any process known to the skilled artisan, such that only the blocking layer 112 is removed and no other layers/materials are removed. The blocking layer 112 may be removed by a plasma treatment process comprising flowing one or more of hydrogen ($H_2$) or argon (Ar). In one or more embodiments, the plasma treatment process comprises increasing a density of the first TiN layer 110. In some embodiments, the plasma comprises hydrogen ($H_2$). In some embodiments, the plasma is a remote plasma. In some embodiments, the plasma is a capacitively coupled plasma (CCP) with a pulsed hydrogen ($H_2$) supply. Advantageously, the plasma treatment processes removes only the blocking layer 112 and does not remove the first TiN layer 110 or the second TiN layer 120.

FIG. 2G illustrates a cross-sectional schematic view of the semiconductor device 100 of FIG. 2F after forming a third titanium nitride (TiN) layer. In one or more embodiments, the first TiN layer 110, the second TiN layer 120, and the third TiN layer have the same composition. The first TiN layer 110, the second TiN layer 120, and the third TiN layer combine to fill the trench with a titanium nitride (TiN) gapfill material (operation 17 of method 10) that is substantially free of seams and/or voids. Accordingly, the reference numeral 150 denotes a combination of the first TiN layer 110, the second TiN layer 120, and the third TiN layer as a TiN gapfill material that is free of seams and/or voids or substantially free of seams and/or voids.

Figure 3:
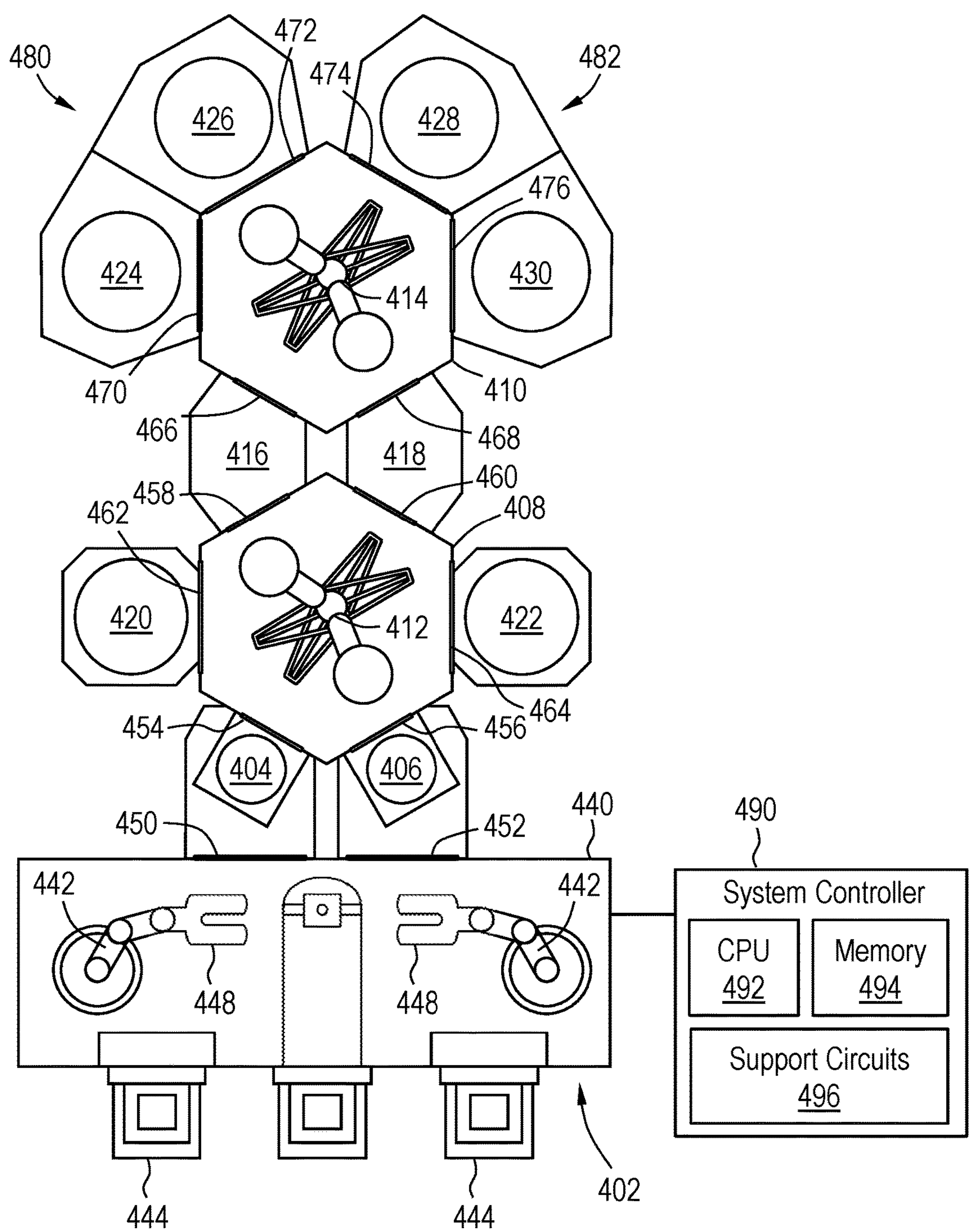
FIG. 3 illustrates a schematic top-view diagram of an example multi-chamber processing system in accordance with one or more embodiments of the disclosure.

As used in this regard, "substantially free" means that less than about 5%, including less than about 4%, less than about 3%, less than about 2%, less than about 1%, less than about 0.5%, and less than about 0.1% of the total composition of the inner spacer 260 on an atomic basis, comprises seams and/or voids. In FIG. 3, Advantageously, one or more embodiments provide a TiN gapfill material 150 that is free of seams or voids.

Some embodiments of the disclosure are directed to integrated processes which are performed within a single cluster tool. FIG. 3 is a schematic top-view diagram of an example multi-chamber processing system 400 according to one or more embodiments. FIG. 3 illustrates a schematic top-view diagram of an example of a multi-chamber processing system 400 according to embodiments of the present disclosure. The processing system 400 generally includes a factory interface 402, load lock chambers 404, 406, transfer chambers 408, 410 with respective transfer robots 412, 414, holding chambers 416, 418, and processing chambers 420, 422, 424, 426, 428, 430. As detailed herein, wafers in the processing system 400 can be processed in and transferred between the various chambers without exposing the wafers to an ambient environment exterior to the processing system 400 (e.g., an atmospheric ambient environment such as may be present in a fab). For example, the wafers can be processed in and transferred between the various chambers in a low pressure (e.g., less than or equal to about 40 to 80 Torr) or vacuum environment without breaking the low pressure or vacuum environment between various processes performed on the wafers in the processing system 400. Accordingly, the processing system 400 may provide an integrated solution for some processing of wafers.

In the illustrated example of FIG. 3, the factory interface 402 includes a docking station 440 and factory interface robots 442 to facilitate transfer of wafers. The docking station 440 is configured to accept one or more front opening unified pods (FOUPs) 444. In some examples, each factory interface robot 442 generally comprises a blade 448 disposed on one end of the respective factory interface robot 442 configured to transfer the wafers from the factory interface 402 to the load lock chambers 404, 406.

The load lock chambers 404, 406 have respective ports 450, 452 coupled to the factory interface 402 and respective ports 454, 456 coupled to the transfer chamber 408. The transfer chamber 408 further has respective ports 458, 460 coupled to the holding chambers 416, 418 and respective ports 462, 464 coupled to processing chambers 420, 422. Similarly, the transfer chamber 410 has respective ports 466, 468 coupled to the holding chambers 416, 418 and respective ports 470, 472, 474, 476 coupled to processing chambers 424, 426, 428, 430. The ports 454, 456, 458, 460, 462, 464, 466, 468, 470, 472, 474, 476 can be, for example, slit valve openings with slit valves for passing wafers therethrough by the transfer robots 412, 414 and for providing a seal between respective chambers to prevent a gas from passing between the respective chambers. Generally, any port is open for transferring a wafer therethrough. Otherwise, the port is closed.

The load lock chambers 404, 406, transfer chambers 408, 410, holding chambers 416, 418, and processing chambers 420, 422, 424, 426, 428, 430 may be fluidly coupled to a gas and pressure control system (not specifically illustrated). The gas and pressure control system can include one or more gas pumps (e.g., turbo pumps, cryo-pumps, roughing pumps), gas sources, various valves, and conduits fluidly coupled to the various chambers. In operation, a factory interface robot 442 transfers a wafer from a FOUP 444 through a port 450 or 452 to a load lock chamber 404 or 406. The gas and pressure control system then pumps down the load lock chamber 404 or 406. The gas and pressure control system further maintains the transfer chambers 408, 410 and holding chambers 416, 418 with an interior low pressure or vacuum environment (which may include an inert gas). Hence, the pumping down of the load lock chamber 404 or 406 facilitates passing the wafer between, for example, the atmospheric environment of the factory interface 402 and the low pressure or vacuum environment of the transfer chamber 408.

With the wafer in the load lock chamber 404 or 406 that has been pumped down, the transfer robot 412 transfers the wafer from the load lock chamber 404 or 406 into the transfer chamber 408 through the port 454 or 456. The transfer robot 412 is then capable of transferring the wafer to and/or between any of the processing chambers 420, 422 through the respective ports 462, 464 for processing and the holding chambers 416, 418 through the respective ports 458, 460 for holding to await further transfer. Similarly, the transfer robot 414 is capable of accessing the wafer in the holding chamber 416 or 418 through the port 466 or 468 and is capable of transferring the wafer to and/or between any of the processing chambers 424, 426, 428, 430 through the respective ports 470, 472, 474, 476 for processing and the holding chambers 416, 418 through the respective ports 466, 468 for holding to await further transfer. The transfer and holding of the wafer within and among the various chambers can be in the low pressure or vacuum environment provided by the gas and pressure control system.

The processing chambers 420, 422, 424, 426, 428, 430 can be any appropriate chamber for processing a wafer. In some embodiments, the processing chambers 420, 422, 424, 426, 428, 430 can be capable of performing a pre-treatment process, a cleaning process, a deposition process, such as an ALD process, a blocking layer deposition process, or an epitaxial growth processes.

In one or more embodiments, forming one or more of the first TiN layer, the second TiN layer, or the third TiN layer and forming the blocking layer occurs in the same semiconductor processing chamber 420, 422, 424, 426, 428, 430.

A system controller 490 is coupled to the processing system 400 for controlling the processing system 400 or components thereof. For example, the system controller 490 may control the operation of the processing system 400 using a direct control of the chambers 404, 406, 408, 416, 418, 410, 420, 422, 424, 426, 428, 430 of the processing system 400 or by controlling controllers associated with the chambers 404, 406, 408, 416, 418, 410, 420, 422, 424, 426, 428, 430. In operation, the system controller 490 enables data collection and feedback from the respective chambers to coordinate performance of the processing system 400.

The system controller 490 generally includes a central processing unit (CPU) 492, memory 494, and support circuits 496. The CPU 492 may be one of any form of a general-purpose processor that can be used in an industrial setting. The memory 494, or non-transitory computer-readable medium, is accessible by the CPU 492 and may be one or more of memory such as random-access memory (RAM), read only memory (ROM), floppy disk, hard disk, or any other form of digital storage, local or remote. The support circuits 496 are coupled to the CPU 492 and may comprise cache, clock circuits, input/output subsystems, power supplies, and the like. The various methods disclosed herein may generally be implemented under the control of the CPU 492 by the CPU 492 executing computer instruction code stored in the memory 494 (or in memory of a particular process chamber) as, for example, a software routine. When the computer instruction code is executed by the CPU 492, the CPU 492 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 408, 410 and the holding chambers 416, 418. In other examples, more or fewer transfer chambers (e.g., one transfer chamber) and/or more or fewer holding chambers (e.g., no holding chambers) may be implemented as a transfer apparatus in a processing system.

One or more embodiments provide a non-transitory computer readable medium (e.g., memory 494) including instructions, that, when executed by a controller (e.g., controller 490) of a processing chamber (or a multi-chamber processing system 400), causes the processing chamber to perform the operations of method 10.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a semiconductor device, the method comprising:

conformally depositing a first titanium nitride (TiN) layer on a semiconductor structure formed on a top surface of a semiconductor substrate, the semiconductor structure comprising a plurality of nanosheets, each of the plurality of nanosheets separated by a trench;

exposing the plurality of nanosheets having the first TiN layer thereon to a blocking compound to form a blocking layer on a portion of the first TiN layer;

forming a second titanium nitride (TiN) layer to fill a portion of the trench, the second TiN layer growing from within the trench;

removing the blocking layer; and forming a third titanium nitride (TiN) layer, the first TiN layer, the second TiN layer, and the third TiN layer combining to fill the trench with a titanium nitride (TiN) gapfill material that is substantially free of seams and voids.

2. The method of claim 1, wherein the semiconductor structure is formed by patterning a superlattice structure on the top surface of the semiconductor substrate, the superlattice structure comprising a plurality of nanosheet channel layers and a corresponding plurality of nanosheet release layers alternatingly arranged in a plurality of stacked pairs to remove the plurality of nanosheet release layers.

3. The method of claim 2, wherein the plurality of nanosheet channel layers comprise silicon germanium (SiGe) and the plurality of nanosheet release layers comprise silicon (Si).

4. The method of claim 2, wherein the plurality of nanosheet channel layers comprise silicon (Si) and the plurality of nanosheet release layers comprise silicon germanium (SiGe).

5. The method of claim 1, wherein forming one or more of the first TiN layer, the second TiN layer, or the third TiN layer comprises exposing the semiconductor structure to a titanium-containing precursor and a nitrogen-containing precursor.

6. The method of claim 5, wherein the titanium-containing precursor comprises titanium tetrachloride ($TiCl_4$) and the nitrogen-containing precursor comprises ammonia ($NH_3$).

7. The method of claim 1, wherein the blocking compound comprises a formula of $R_1—C≡C—R_2$, where each of $R_1$ and $R_2$ are independently hydrogen (H) or an alkyl chain, a formula of $H—C≡C—R_3$, where $R_3$ is an alkyl chain, a formula of $R—SiH_3$s, where R is an alkyl chain, a formula of $R—SiCl_3$, where R is an alkyl chain, or a formula of R—SH, where R is an alkyl chain.

8. The method of claim 7, wherein $R_1$ and $R_2$ are the same.

9. The method of claim 1, wherein forming one or more of the first TiN layer, the second TiN layer, or the third TiN layer and forming the blocking layer occurs in the same semiconductor processing chamber.

10. The method of claim 9, wherein the semiconductor processing chamber is an atomic layer deposition (ALD) chamber.

11. The method of claim 1, wherein the semiconductor device is a gate-all-around (GAA) transistor.

12. A method of forming a gate-all-around (GAA) transistor, the method comprising:

forming a superlattice structure on a top surface of a substrate, the superlattice structure comprising a plurality of nanosheet channel layers and a corresponding plurality of nanosheet release layers alternatingly arranged in a plurality of stacked pairs;

patterning the superlattice structure to remove the plurality of nanosheet release layers and form a semiconductor structure comprising a plurality of nanosheets, each of the plurality of nanosheets separated by a trench;

conformally depositing a first titanium nitride (TiN) layer on the plurality of nanosheets;

exposing the plurality of nanosheets having the first TiN layer thereon to a blocking compound to form a blocking layer on a portion of the first TiN layer;

forming a second titanium nitride (TiN) layer to fill a portion of the trench, the second TiN layer growing from within the trench;

removing the blocking layer; and forming a third titanium nitride (TiN) layer, the first TiN layer, the second TiN layer, and the third TiN layer combining to fill the trench with a titanium nitride (TiN) gapfill material that is substantially free of seams and voids.

13. The method of claim 12, wherein the plurality of nanosheet channel layers comprise silicon (Si) and the plurality of nanosheet release layers comprise silicon germanium (SiGe).

14. The method of claim 12, wherein the plurality of nanosheet channel layers comprise silicon germanium (SiGe) and the plurality of nanosheet release layers comprise silicon (Si).

15. The method of claim 12, wherein forming one or more of the first TiN layer, the second TiN layer, or the third TIN layer comprises exposing the semiconductor structure to a titanium-containing precursor and a nitrogen-containing precursor.

16. The method of claim 15, wherein the titanium-containing precursor comprises titanium tetrachloride ($TiCl_4$) and the nitrogen-containing precursor comprises ammonia ($NH_3$).

17. The method of claim 12, wherein the blocking compound comprises a formula of $R_1—C≡C—R_2$, where each of $R_1$ and $R_2$ are independently hydrogen (H) or an alkyl chain, a formula of $H—C≡C—R_3$, where $R_3$ is an alkyl chain, a formula of $R—SiH_3$, where R is an alkyl chain, a formula of $R—SiCl_3$, where R is an alkyl chain, or a formula of R—SH, where R is an alkyl chain.

18. The method of claim 17, where $R_1$ and $R_2$ are the same.

19. The method of claim 12, wherein forming one or more of the first TiN layer, the second TiN layer, or the third TiN layer and forming the blocking layer occurs in the same semiconductor processing chamber.

20. A non-transitory computer readable medium including instructions, that, when executed by a controller of a processing chamber, causes the processing chamber to:

conformally deposit a first titanium nitride (TiN) layer on a semiconductor structure formed on a top surface of a semiconductor substrate, the semiconductor structure comprising a plurality of nanosheets, each of the plurality of nanosheets separated by a trench;

expose the plurality of nanosheets having the first TiN layer thereon to a blocking compound to form a blocking layer on a portion of the first TiN layer;

form a second titanium nitride (TiN) layer to fill a portion of the trench, the second TiN layer growing from within the trench;

remove the blocking layer; and form a third titanium nitride (TiN) layer, the first TiN layer, the second TiN layer, and the third TiN layer combining to fill the trench with a titanium nitride (TiN) gapfill material that is substantially free of seams and voids.

* * * * *